(12) United States Patent
Gruber et al.

(10) Patent No.: US 10,062,671 B2
(45) Date of Patent: Aug. 28, 2018

(54) CIRCUIT BOARD EMBEDDING A POWER SEMICONDUCTOR CHIP

(71) Applicant: Infineon Technologies AG, Neubiberg (DE)

(72) Inventors: Martin Gruber, Schwandorf (DE); Angela Kessler, Sinzing (DE); Thorsten Scharf, Regensburg (DE)

(73) Assignee: Infineon Technologies AG, Neubiberg (DE)

( * ) Notice: Subject to any disclaimer, the term of this patent is extended or adjusted under 35 U.S.C. 154(b) by 105 days.

(21) Appl. No.: 15/134,984

(22) Filed: Apr. 21, 2016

(65) Prior Publication Data

US 2016/0316567 A1 Oct. 27, 2016

(30) Foreign Application Priority Data

Apr. 22, 2015 (DE) .................. 10 2015 106 151

(51) Int. Cl.
| | | |
|---|---|---|
| *H05K 1/18* | (2006.01) | |
| *H01L 25/07* | (2006.01) | |
| *H01L 23/367* | (2006.01) | |
| *H01L 23/498* | (2006.01) | |
| *H01L 25/11* | (2006.01) | |
| *H01L 25/16* | (2006.01) | |

(52) U.S. Cl.
CPC ........ *H01L 25/072* (2013.01); *H01L 23/3672* (2013.01); *H01L 23/49811* (2013.01); *H01L 25/115* (2013.01); *H01L 25/16* (2013.01)

(58) Field of Classification Search
CPC .......... H01L 23/3672; H01L 23/49811; H01L 25/072; H01L 25/115; H01L 25/16
See application file for complete search history.

(56) References Cited

U.S. PATENT DOCUMENTS

| | | | | |
|---|---|---|---|---|
| 4,454,529 | A * | 6/1984 | Philofsky | ................. H01G 4/40 257/665 |
| 6,731,524 | B2 * | 5/2004 | Elek | ........................ H02M 1/34 323/207 |
| 7,675,148 | B2 * | 3/2010 | Lim | .................... H01L 23/4334 257/676 |
| 8,319,334 | B2 | 11/2012 | Standing | |
| 2009/0091889 | A1 | 4/2009 | Oman et al. | |
| 2010/0127383 | A1 * | 5/2010 | Oka | ........................ H01L 24/40 257/692 |
| 2010/0224992 | A1 * | 9/2010 | McConnelee | ....... H01L 23/5383 257/723 |
| 2011/0031611 | A1 * | 2/2011 | Standing | ............. H01L 21/4846 257/700 |
| 2012/0320545 | A1 * | 12/2012 | Lo Presti | ............... H05K 1/145 361/752 |

(Continued)

FOREIGN PATENT DOCUMENTS

WO WO2014/197917 * 12/2014

*Primary Examiner* — Yuriy Semenenko
(74) *Attorney, Agent, or Firm* — Murphy, Bilak & Homiller, PLLC

(57) ABSTRACT

A semiconductor module includes a circuit board and a power semiconductor chip embedded in the circuit board. The power semiconductor chip has a first load electrode. The semiconductor module further includes a power terminal connector electrically connected to the first load electrode. The embedded power semiconductor chip is positioned laterally within a footprint zone of the power terminal connector.

13 Claims, 5 Drawing Sheets

(56) References Cited

U.S. PATENT DOCUMENTS

| | | | |
|---|---|---|---|
| 2013/0082387 A1* | 4/2013 | Stolze | H01L 23/3121 257/771 |
| 2013/0161801 A1* | 6/2013 | Otremba | H01L 23/24 257/668 |
| 2015/0077941 A1* | 3/2015 | Hosseini | H01L 23/3733 361/704 |
| 2016/0133558 A1* | 5/2016 | Stahr | H01L 23/36 257/692 |

* cited by examiner

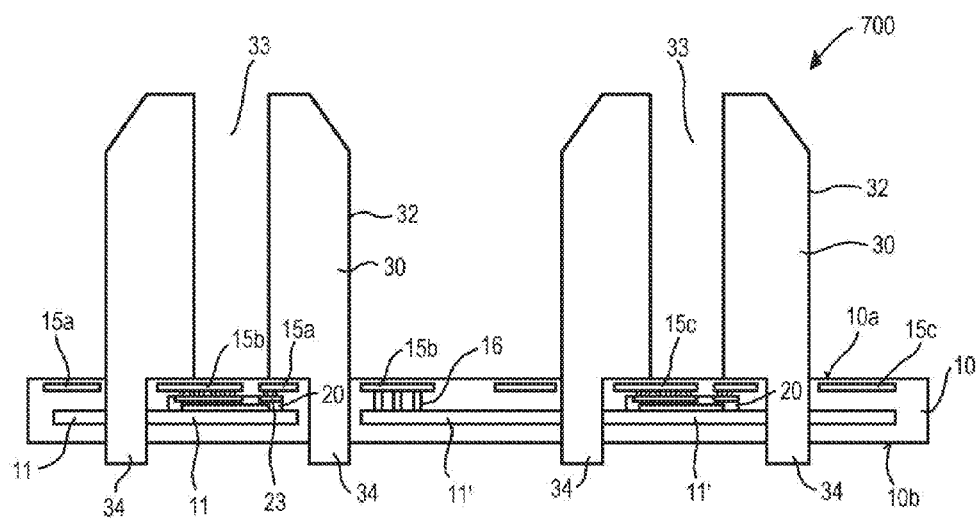
Fig. 7
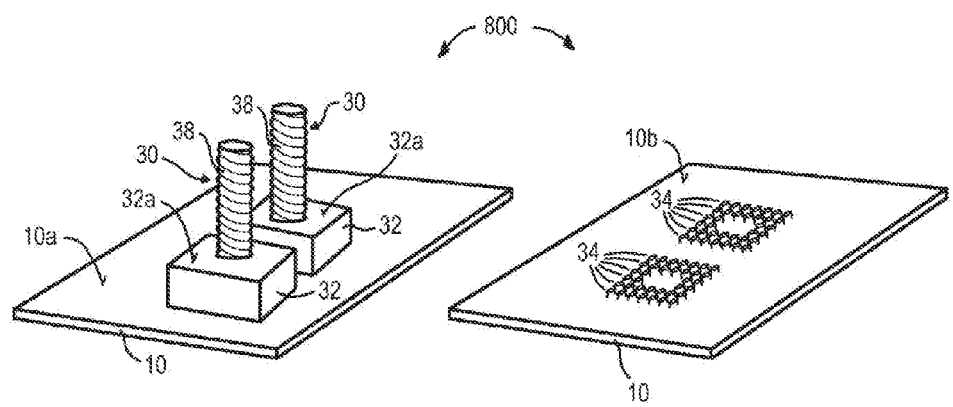
Fig. 8A
Fig. 8B

CIRCUIT BOARD EMBEDDING A POWER SEMICONDUCTOR CHIP

TECHNICAL FIELD

This invention generally relates to semiconductor modules having embedded active components, and in particular to the technique of embedding a semiconductor power chip into a circuit board.

BACKGROUND

PCB (printed circuit board) manufacturers are constantly striving to increase the performance of their products, while decreasing their cost of manufacture. Recent advancements in PCB technology utilize chip embedding concepts for power devices. Embedding of a power chip in a PCB is a space-saving approach for advanced power device design. Low cost devices of high thermal robustness, improved heat dissipation capability and increased reliability and electrical performance are desirable.

BRIEF DESCRIPTION OF THE DRAWINGS

The accompanying drawings are included to provide a further understanding of embodiments and are incorporated in and constitute a part of this specification. The drawings illustrate embodiments and, together with the description, serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

FIG. 7 schematically illustrates a cross-sectional view of an exemplary semiconductor module 700 including a circuit board, two power semiconductor chips embedded therein and a power terminal connector.

FIGS. 8A and 8B schematically illustrate perspective top and bottom views, respectively, of an exemplary semiconductor module 800 including, e.g., two embedded power semiconductor chips each located under one power terminal connector.

DETAILED DESCRIPTION

Figure 1A:
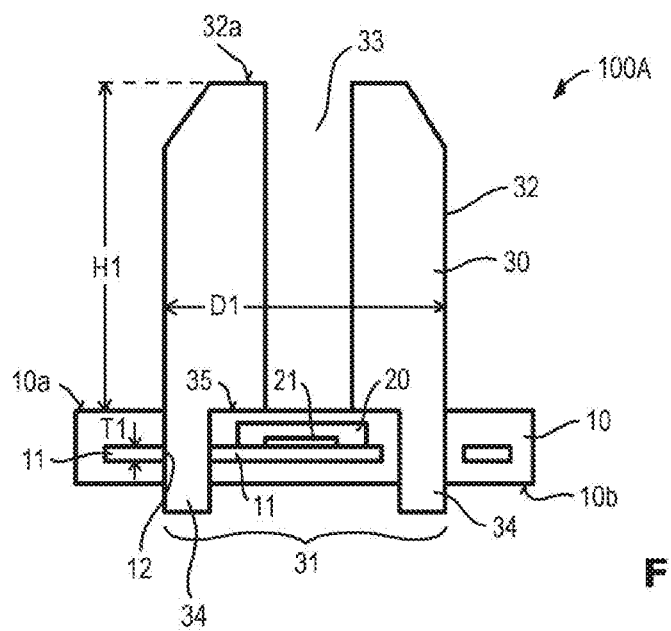
FIGS. 1A and 1B schematically illustrate a cross-sectional views of exemplary semiconductor modules 100A and 100B, respectively, including a circuit board, a power semiconductor chip embedded therein and a power terminal connector.

In the following detailed description, reference is made to the accompanying drawings, which form a part thereof, and in which is shown by way of illustration specific embodiments in which the invention may be practiced. In this regard, directional terminology, such as "top", "bottom", "front", "back", "upper", "lower", etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other unless specifically noted otherwise.

Further, as employed in this specification, the terms "bonded", "attached", "connected", "coupled" and/or "electrically connected/electrically coupled" are not meant to mean that the elements or layers must directly be contacted together; intervening elements or layers may be provided between the "bonded", "attached", "connected", "coupled" and/or "electrically connected/electrically coupled" elements, respectively. However, in accordance with the disclosure, the above-mentioned terms may, optionally, also have the specific meaning that the elements or layers are directly contacted together, i.e. that no intervening elements or layers are provided between the "bonded", "attached", "connected", "coupled" and/or "electrically connected/electrically coupled" elements, respectively.

Further, the words "over" or "above" used with regard to a part, element or material layer formed or located "over" or "above" a surface may be used herein to mean that the part, element or material layer be located (e.g. placed, formed, deposited, etc.) "directly on", e.g. in direct contact with, the implied surface. The words "over" or "above" used with regard to a part, element or material layer formed or located "over" or "above" a surface may be used herein to mean that the part, element or material layer be located (e.g. placed, formed, deposited, etc.) "indirectly on" the implied surface with one or more additional parts, elements or layers being arranged between the implied surface and the part, element or material layer. The same applies analogously to the terms or "under", "below", "beneath", etc.

The semiconductor modules described herein contain one or more power semiconductor chip(s) which is (are) embedded in a circuit board. This or these power semiconductor chip(s) may be of different types and may be manufactured by different technologies. They include (monolithic) power integrated circuits and may further include, for example, logic integrated circuits, analogue integrated circuits, mixed signal integrated circuits, or memory circuits.

The power semiconductor chip(s) referred to herein may be manufactured from specific semiconductor material such as, for example, Si, SiC, SiGe, GaAs, GaN, AlGaN, InGaAs, InAlAs, etc, and, furthermore, may contain inorganic and/or organic materials that are not semiconductors.

The power semiconductor chip(s) referred to herein may, e.g., be power switches, power transistors, power diodes, etc. They may additionally include control circuits, microprocessors and/or memory circuits.

The power semiconductor chip(s) referred to herein may, for example, be configured as power MISFETs (Metal Insulator Semiconductor Field Effect Transistors) power MOSFETs (Metal Oxide Semiconductor Field Effect Transistors), IGBTs (Insulated Gate Bipolar Transistors), JFETs (Junction Gate Field Effect Transistors), HEMTs (High Electron Mobility Transistors), power bipolar transistors or power diodes such as, e.g., a PIN diode or a Schottky diode.

The power semiconductor chip(s) referred to herein may, e.g., have a vertical structure, that is to say that the semiconductor chip(s) may be fabricated in such a way that electric currents can flow in a direction perpendicular to the main surfaces of the semiconductor chip(s). A power semiconductor chip having a vertical structure has electrodes on its two main surfaces, that is to say on its top and bottom side surfaces.

The power semiconductor chip(s) referred to herein may have a horizontal structure. A power semiconductor chip having a horizontal structure often has chip electrodes only on one of its two main surfaces, e.g., on its active surface. The opposite main surface may typically be the mounting surface of the power semiconductor chip.

The semiconductor modules described herein may further include one or more additional electronic components. The electronic component(s) may, e.g., also be embedded in the circuit board and/or one or more electronic component(s) may, e.g., be mounted on one or both surfaces of the circuit board. The electronic component(s) may be designed as passive or active components. A passive component may, e.g., be a resistor, a capacitor, an inductor, a clock, and/or an integrated passive device (PID). An active component may, e.g., be a logic semiconductor chip, a memory semiconductor chip, a driver semiconductor chip to drive one or more of the power semiconductor chips, a level shifter, and a microcontroller chip.

The semiconductor modules described herein contains a circuit board or printed circuit board (PCB). The circuit board embeds the at least one power semiconductor chip. The circuit board may comprise one or more electrically conductive layers and one or more insulating layers (or dielectric layers) arranged between the electrically conductive layers. The insulating layers may, e.g., comprise or be made of any appropriate thermoplastic or thermoset material. By way of example, the insulating layers may comprise or be made of epoxy resin, polytetrafluoroethylene, aramid fibers or carbon fibers and may include reinforcement means such as fiber mats, for example glass or carbon fibers. The insulating layers may comprise or be made of a prepreg (short for pre-impregnated fibers), that is, e.g., made of a combination of a fiber mat, for example glass or carbon fibers, and a resin, for example a thermoset or thermoplastic material. Prepreg materials are known in the art and are typically used to manufacture PCBs. The circuit board may be a rigid, a flexible or a rigid-flexible PCB.

A variety of different types of semiconductor modules may be designed in accordance with the disclosure herein. By way of example, a semiconductor module as disclosed herein may optionally comprise two or more power semiconductor chips such as, e.g., MISFETs, MOSFETs, or HEMTs embedded in the circuit board and, e.g., a logic integrated circuit as the (optional) electronic component embedded in the circuit board. For instance, a semiconductor module disclosed herein may comprise a half-bridge circuit including a high side transistor, a low side transistor and, optionally, a logic integrated circuit chip serving as, e.g., a transistor gate driver. Further, the semiconductor module disclosed herein may comprise a full-bridge such as, e.g., a B6 circuit including, e.g., 6 power transistors and (optionally) a logic integrated circuit chip serving as, e.g., a power transistor gate driver.

The semiconductor modules and, in particular, half-bridge or full-bridge circuits as disclosed herein may, e.g., be implemented in an electronic circuit constituting a power supply, a voltage converter, a rectifier, a PFC (power factor correction) circuit, etc. By way of example, a voltage converter may be configured for converting DC or AC voltages into DC voltages, so-called DC-DC converters and AC-DC converters, respectively. DC-DC converters may be used to convert a DC input voltage provided by a battery or rechargeable battery into a DC output voltage matched to the demands of electronic circuits connected downstream. A DC-DC converter described herein may, e.g., be a buck converter or a down-converter. AC-DC converters may be used to convert an AC input voltage provided by, e.g., a high voltage AC power network into a DC output voltage matched to the demands of electronic circuits connected downstream.

Referring to FIG. 1A, a semiconductor module 100A comprises a circuit board 10 embedding a power semiconductor chip 20. Embedding may mean complete encasing, i.e. the semiconductor power chip 20 may be completely integrated into the construction of the circuit board 10, without any surface of the semiconductor power chip 20 remaining exposed.

The semiconductor module 100A further comprises a power terminal connector 30 which is positioned above the power semiconductor chip 20 with the power semiconductor chip 20 being located laterally within a footprint zone 31 of the power terminal connector 30. In other words, the power terminal connector 30 is placed directly above the power semiconductor chip 20 in a sense that the outline of the terminal connector 30 in a vertical projection surrounds the outline of the power semiconductor chip 20. Thus, the power semiconductor chip 20 is completely covered by the power terminal connector 30. That way, as heat dissipation paths are short, heat generated in the power semiconductor chip 20 is effectively conducted to the power terminal connector 30 and removed from the semiconductor module 100A.

The power semiconductor chip 20 may be mounted on a first conductive layer 11 of the circuit board 10. The first conductive layer 11 may be made of any metal or metal alloy, e.g. copper or a copper alloy. The first conductive layer 11 may have a thickness T1 in the range from about, e.g., 10 µm to 400 µm. In particular, the thickness T1 of the first conductive layer 11 may be equal to or greater than or less than 20 µm, 40 µm, 60 µm, 80 µm, 100 µm, 150 µm, 200 µm, 250 µm, 300 µm, 350 µm, 400 µm, 450 µm, and 500 µm.

The first conductive layer 11 may serve as a chip carrier. That is, the power semiconductor chip 20 may be attached or bonded to the first conductive layer 11. Further, by way of example, a first load electrode 21 of the power semiconductor chip 20 may be electrically and mechanically connected to the first conductive layer 11 of the circuit board 10 by a bond layer (not shown). The bond layer may, e.g., comprise or consist of solder, a soft solder, a hard solder, a diffusion solder, an electrically conducting paste, a nano-paste, a sinter metal material, or an electrically conducting adhesive.

By way of example, if the bond layer (not shown) is, e.g., of a solder material such as, e.g., AuSn, AgSn, CuSn, AgIn, AuIn, CuIn, AuSi, Sn, or Au, or of an electrically conducting paste containing metal particles distributed in a polymer material (so-called nano-paste), the bond layer may be generated by the application of heat in order to reflow, sinter or cure the bonding material.

The power terminal connector 30 is electrically connected to the first load electrode 21 of the power semiconductor chip 20. The power terminal connector 30 is configured as an external terminal of the semiconductor module 100A. The power terminal connector 30 may allow to conduct high currents used by external applications to or from the semiconductor module 100A. To that end, the power terminal connector 30 may be designed to have a connector part or element 32 projecting over a first (upper) surface 10a of the circuit board 10. The connector element 32 of the terminal connector 30 may have engaging means for being assembled or attached to external power circuitry. The engaging means may be designed, e.g., as a hole 33, in particular a threaded hole, or a clamping means (not shown), a threaded bolt (see FIG. 8A), etc. If, e.g., a threaded bolt is used, the threaded bolt may be integral with the connector element 32 or may be fixedly inserted or screwed in the hole 33 thereof and may provide a thread for screwing the semiconductor module 100A to another threaded hole (not shown) or an external application.

The power terminal connector 30 or, more specifically, the connector element 32 thereof may have a height H1 as measured from the first (upper) surface 10a of the circuit board 10 to an upper surface 32a of the connector element 32 of the power terminal connector 30 that is equal to or greater than 5 mm, 8 mm, 10 mm, 12 mm, 14 mm, 16 mm, 18 mm, or 20 mm.

The power terminal connector 32 or, more specifically, the connector element 30 thereof may have a minimum lateral dimension D1. The minimum lateral dimension D1 may, e.g., be equal to or greater than 4 mm, 6 mm, 8 mm, or 10 mm. The (minimum) lateral dimension D1 should be equal to or greater than the corresponding (maximum) lateral dimension of the power semiconductor chip 20. This ensures that the power terminal connector 30 or, more specifically, the connector element 32 thereof may completely cover the entire power semiconductor chip 20.

By way of example, if the power semiconductor chip 20 is, e.g., a 2×2 mm or, e.g., a 3×3 mm power semiconductor chip, the connector element 32 may have lateral dimensions D1 of 5×5 mm, or 6×6 mm, etc. That way, as the connector element 32 completely covers the power semiconductor chip 20, heat dissipated in the power semiconductor chip 20 is effectively transferred to and removed by the connector element 32 of the power terminal connector 30.

The connector element 32, if configured as a threaded element having a threaded hole or a threaded bolt, may have a metric thread such as, e.g., a M6, M8, or M10 thread. The power terminal connector 30 may, e.g., comprise or be of a metal such as, e.g., copper, copper alloy, zinc coated copper or copper alloy, aluminum, steel, brass, or chromed brass. Further, the power terminal connector 30 or, more specifically, the connector element 32 thereof may have a topologically structured or grooved surface in order to enhance the surface area acting for heat removal by thermal radiation and/or convection. That way, the thermal connector 30 not only serves as a highly efficient thermal conductor but additionally as a heat sink or cooling element.

By way of example, without loss of generality, the power semiconductor chip 20 may, e.g., be configured as a power transistor, for example, a power MOSFET, IGBT, JFET or power bipolar transistor, or a power diode. In the case of a power MOSFET or a JFET, the first load electrode 21 may, e.g., be a drain electrode, a second load electrode (not shown in FIG. 1A) may be a source electrode, and a third electrode (not shown in FIG. 1A) may be a gate electrode. In the case of an IGBT, the first load electrode 21 may be a collector electrode, a second load electrode (not shown in FIG. 1A) may be an emitter electrode, and a third electrode (not shown in FIG. 1) may be a gate electrode. In the case of a power bipolar transistor, the first load electrode 21 may be collector electrode, a second load electrode (not shown in FIG. 1A) may be an emitter electrode, and a third electrode (not shown in FIG. 1A) may be a base electrode. In the case of a power diode, first and second load electrodes are anode and cathode, respectively, and there is no third electrode. During operation, voltages higher than 5, 50, 100, 500 or 1000 V may be applied between the first and second load electrodes. A switching frequency applied to the third electrode (not shown) may be in the range from 1 kHz to 100 MHz, but may also be outside of this range.

The power terminal connector 30 is fixedly secured to the circuit board 10. By way of example, the first electrically conducting layer 11 of the circuit board 10 may comprise holes 12 each configured to receive a press-fit pin 34 of the power terminal connector 30. More specifically, an end face 35 of the power terminal connector 30 may be equipped with an array of press-fit pins 34 protruding from the end face 35 in a direction normal to the end face 35 (and also normal to the first (upper) surface 10a or the circuit board 10, to which the end face 35 may abut) and configured to establish force-locked connections with a corresponding array of holes 12 in the first electrically conductive layer 10. The press-fit pins 34 may pass through the circuit board 10 and may protrude from a second (bottom) surface 10b of the circuit board 10.

A press-fit connection between the power terminal connector 30 and the first electrically conductive layer 11 of the circuit board 10 provides for high mechanical stability and high thermal and electrical conductivity. That is, electrical current and heat is effectively transferred from the power semiconductor chip 20 via the first electrically conductive layer 11 to the power terminal connector 30. In addition, as the power terminal connector 30 is positioned directly above the power semiconductor chip 20, heat dissipation paths through the first electrically conductive layer 11 are short. Further, heat removal from the power semiconductor chip 20 may be assisted by direct heat transfer from the power semiconductor chip 20 via the interface between the first (upper) surface 10a of the circuit board 10 and the end face 35 of the power terminal connector 30 to the power terminal connector 30. Thus, in conclusion, the power semiconductor chip 20 embedded in the circuit board 10 is effectively coupled to the power terminal connector 30 in terms of cooling and current supply.

As exemplarily illustrated in FIG. 1A, some of the press-fit pins 34 may not necessarily be fixed within a press-fit hole 12 of the first conductive layer 11. By way of example, through-hole insert connections in which a pin 34 is inserted in a through-hole of the circuit board 10 may also be possible. In some examples, only through-hole insert connections may be used for fixing the power terminal connector 30 to the circuit board 10. In other examples, only press-fit pins 34 will be used and anchored in a corresponding press-fit hole 12 of the first conductive layer 11. Further, it may be possible to use mixed type connections (e.g. press-fit connections and through-hole insert connections) to secure the power terminal connector 30 to the circuit board 10.

Further, it is to be noted that the power semiconductor chip 20 may be mounted on another conductive layer (not shown) of the circuit board 10 than the first conductive layer 11 to which the power terminal connector 30 is secured. In this case the first load electrode 21 of the power semiconductor chip 20 may be electrically and mechanically connected to the other conductive layer (not shown) of the circuit board 10 to ensure the low resistant electrical and thermal connection between the power semiconductor chip 20 and the power terminal connector 30.

Figure 1B:
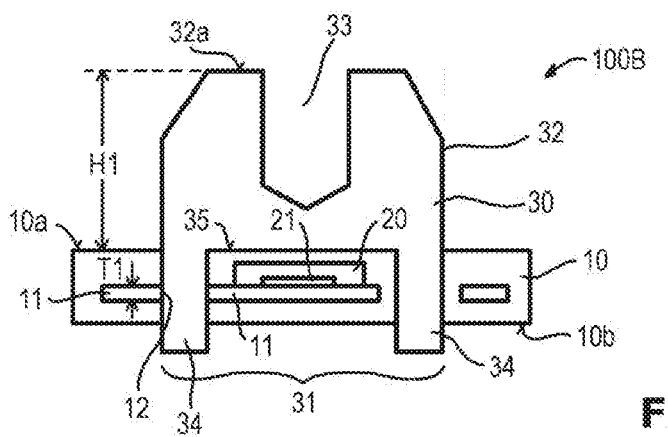

FIG. 1B illustrates an exemplary semiconductor module 100B. Semiconductor module 100B may be similar or identical to semiconductor module 100A except that except that the hole 33 of the connector element is a blind hole or bore rather than a through-hole. Thus, the (bottom) end face 35 of the connector element 32 may, e.g., be a continuous face which may, e.g., completely cover and/or abut to the area of the first (upper) surface 10a of the circuit board 10 located under the connector element 32. That way, heat removal from the semiconductor chip 20 is increased by additional heat dissipation from the top of the semiconductor chip 20 via the first (upper) surface 10a of the circuit board 10 into the bulk connector element 32.

Figure 2:
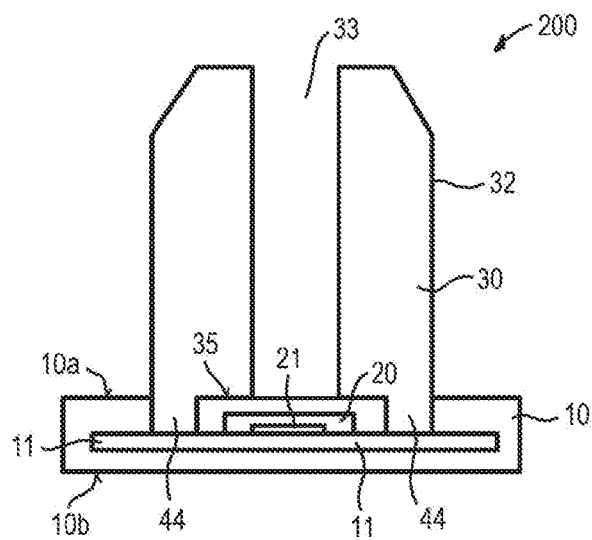
FIG. 2 schematically illustrates a cross-sectional view of an exemplary semiconductor module 200 including a circuit board, a power semiconductor chip embedded therein and a power terminal connector.

FIG. 2 illustrates an exemplary semiconductor module 200. The semiconductor module 200 may be similar or identical to semiconductor module 100A or semiconductor module 100B except that the power terminal connector 30 is equipped with projections 44 instead of the press-fit pins 34 shown in FIG. 1. More specifically, the end face 35 of the power terminal connector 30 may comprise these projections 44. The projections 44 may be soldered or otherwise secured to the first electrically conductive layer 11. The technique of soldering (or sintering, etc.) the projections 44 to the first conductive layer 11 also provides for mechanically stable and electrically and thermally highly conductive connections between the first conductive layer 11 of the circuit board 10 and the power terminal connector 30. As shown in FIG. 2, the projections 44 may, e.g., not pass through the circuit board 10. In view of all other features described in conjunction with FIG. 1A or 1B, reference is made to the description above in order to avoid reiteration.

Figure 3:
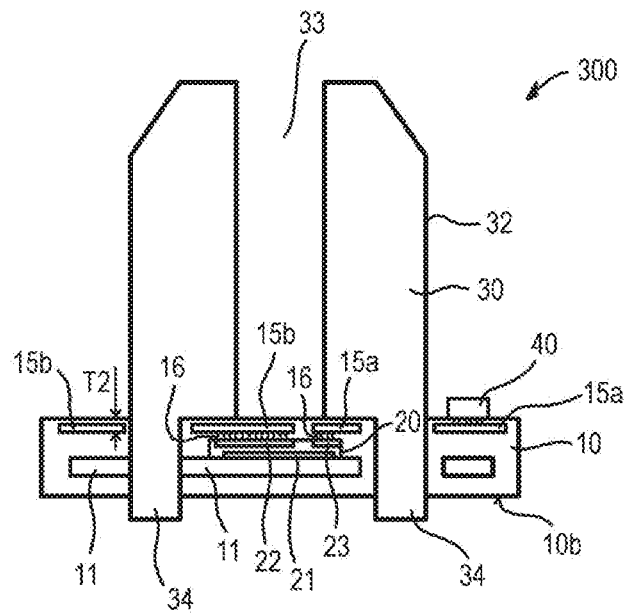
FIG. 3 schematically illustrates a cross-sectional view of an exemplary semiconductor module 300 including a circuit board, a power semiconductor chip embedded therein and a power terminal connector.

FIG. 3 illustrates an exemplary semiconductor module 300. Features of the semiconductor module 300 may be identical or similar to corresponding features of the semiconductor modules 100A, 100B, 200 described above and vice-versa, and reference is made to the description herein to avoid reiteration. Further, the semiconductor module 300 uses a multi-layer circuit board 10. In the multi-layer circuit board 10 at least a second electrically conductive layer 15 is provided. The second electrically conductive layer 15 may be arranged above the first electrically conductive layer 11, e.g. between the first electrically conductive layer 11 and the power semiconductor chip 20 mounted thereon and the first (upper) surface 10a of the circuit board 10.

The second electrically conductive layer 15 may have a thickness T2 which may be equal to or less than T1. As the second electrically conductive layer 15 may not provide for substantial heat removal from the power semiconductor chip 20 and may not be connected mechanically to the power terminal connector 30, the heat removal capability of the second electrically conductive layer 15 may not need to be as high as the heat removal capability of the first conductive layer 11. By way of example, the second electrically conductive layer 15 of the circuit board 10 may have a thickness T2 equal to or greater than or less than 10 μm, 20 μm, 40 μm, 60 μm, 80 μm, 100 μm, 120 μm, 140 μm, 160 μm, 180 μm, or 200 μm.

The second electrically conductive layer 15 may be structured. The second electrically conductive layer 15 may, e.g., serve as an electrical redistribution layer configured to route I/O signals, power supply, gate driver signals, etc. within the circuit board 10.

By way of example, as illustrated in FIG. 3, the second electrically conductive layer 15 may be structured to provide for a first conductor trace 15a which is connected by vias 16 to a control electrode 23, e.g. gate electrode, of the power semiconductor chip 20. As an example, the first conductor trace 15a of the second electrically conductive layer 15 is interconnected to an external terminal 40 of the semiconductor module 300. The external terminal 40 may, in this example, be a control terminal for, e.g., providing an external control signal to the control electrode 23 of the power semiconductor chip 20.

Further, as will be described in more detail further below, the semiconductor module 300 may be equipped with one or more electronic components. Reference sign 40 may also be interpreted as referring to such electronic component which, in the example of FIG. 3, may be mounted on the first (upper) surface 10a of the circuit board 10. The electronic component may also be mounted on the second (lower) surface 10b of the circuit board 10 or may be embedded within the circuit board 10 (see, e.g., FIGS. 5 and 6).

Further, by way of example, the second electrically conductive layer 15 may comprise a second conductor trace 15b which is configured to be electrically connected to a load electrode 22, e.g., source electrode of the power semiconductor chip 20. Again, the connection between the load electrode 22 and the second conductor trace 15b of the second electrically conductive layer 15 may be provided by a number of vias 16 penetrating the insulating (dielectric) material provided between the power semiconductor chip 20 (or the first electrically conductive layer 11) and the second electrically conductive layer 15.

Figure 4:
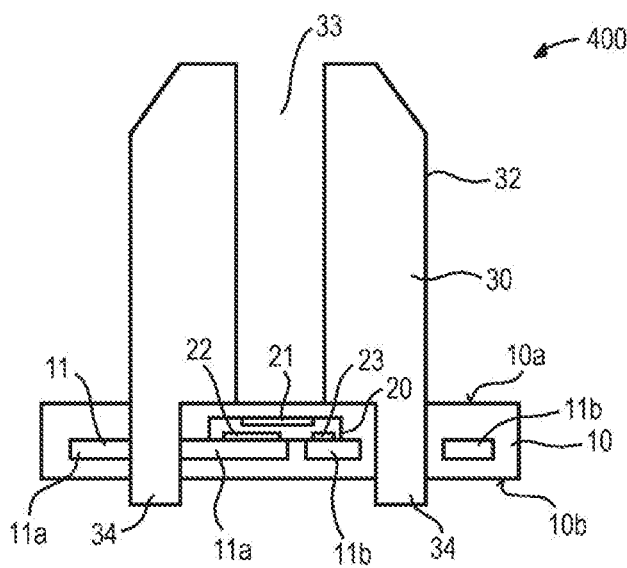
FIG. 4 schematically illustrates a cross-sectional view of an exemplary semiconductor module 400 including a circuit board, a power semiconductor chip embedded therein and a power terminal connector.

FIG. 4 illustrates an exemplary semiconductor module 400. Features of the semiconductor module 400 may be identical or similar to corresponding features of the semiconductor modules 100A, 100B, 200, 300 described above and vice-versa, and reference is made to the description herein to avoid reiteration. As a difference to semiconductor modules 100A, 100B, 200, 300, the power semiconductor chip 20 is mounted on the first conductive layer 11 in a flip-chip orientation.

In this example but also in the other examples disclosed herein the first electrically conductive layer 11 may be structured. By way of example, a first part 11a of the first electrically conductive layer 11 may be electrically connected to a load electrode 22, e.g. the source electrode of the power semiconductor chip 20, and a second part 11b of the first electrically conductive layer 11 may be connected to a control electrode 23, e.g. a gate electrode of the power semiconductor chip 20. The first part 11a and the second part 11b of the first electrically conductive layer 11 may be insular, i.e. electrically disconnected or insulated from each other. That way, the first electrically conductive layer 11 may not only be used to serve as a chip carrier and/or heat removal means and/or mounting platform for the power terminal connector 30 but, in addition, as a multi-current or multi-signal (e.g. load current and/or control signal) conductor for routing load currents and/or control signals across the circuit board 10.

In semiconductor module 400, similar to semiconductor module 300, a second electrically conductive layer 15 (not shown) may be provided and may be configured to be connected, e.g., to another load electrode (not shown) of the power semiconductor chip 20. By way of example, the power semiconductor chip 20 may have a load electrode 21, e.g. drain electrode located at its top main surface, and the second electrically conductive layer 15 (not shown) may be configured to connect through vias 16 to this load electrode 21.

Figure 5:
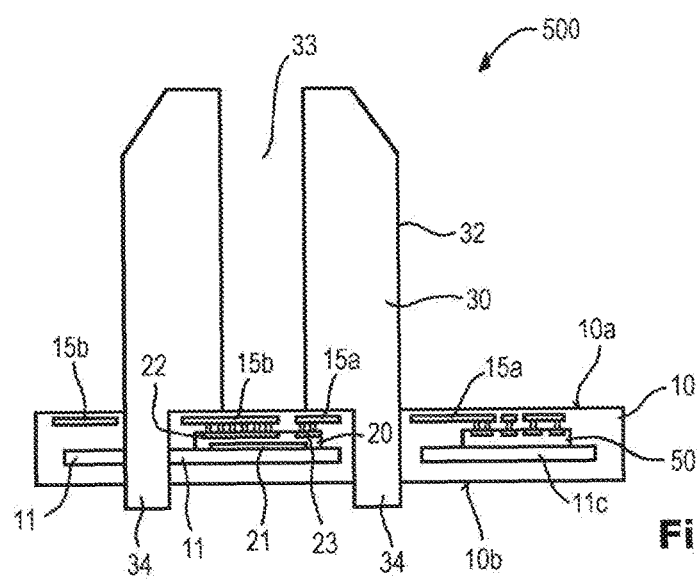
FIG. 5 schematically illustrates a cross-sectional view of an exemplary semiconductor module 500 including a circuit board, a power semiconductor chip and an electronic component embedded therein and a power terminal connector.

FIG. 5 illustrates an exemplary semiconductor module 500. Semiconductor module 500 is similar to semiconductor modules 100A, 100B, 200-400 and features described in conjunction with semiconductor modules 100A, 100B, 200-400 may be implemented in semiconductor module 500 and vice versa.

Semiconductor module 500 comprises an additional electronic component 50 embedded or encased in the circuit board 10. By way of example, the electronic component 50 may be mounted on a third part 11c of the first conductive layer 11. However, it is also possible that the electronic component 50 is mounted on another conductive layer of the circuit board 10 or is embedded in the circuit board 10 without any support or carrier. As mentioned previously, it may also be mounted on one of the first (upper) surface 10a and/or the second (lower) surface 10b of the circuit board 10.

The electronic component 50 may be electrically connected to a control electrode 23 of the power semiconductor chip 20. By way of example, the electrical connection between an I/O electrode of the electronic component 50 and the control electrode 23 of the power semiconductor chip 20 may be provided by the second electrically conductive layer 15 or, more specifically, by a conductor trace 15a thereof. Another possibility, as already explained in conjunction with FIG. 4, is to use the first electrically conductive layer 11 or a structured part 11b thereof to interconnect the control electrode 23 of the semiconductor chip 20 to the electronic component 50.

The electronic component 50 may be a passive or active non-power device. It may, e.g., be a resistor, a capacitor, an inductor, a clock, an integrated passive device (IPD), a logic semiconductor chip, a memory semiconductor chip, a driver semiconductor chip, a micro-controller chip, etc.

Figure 6:
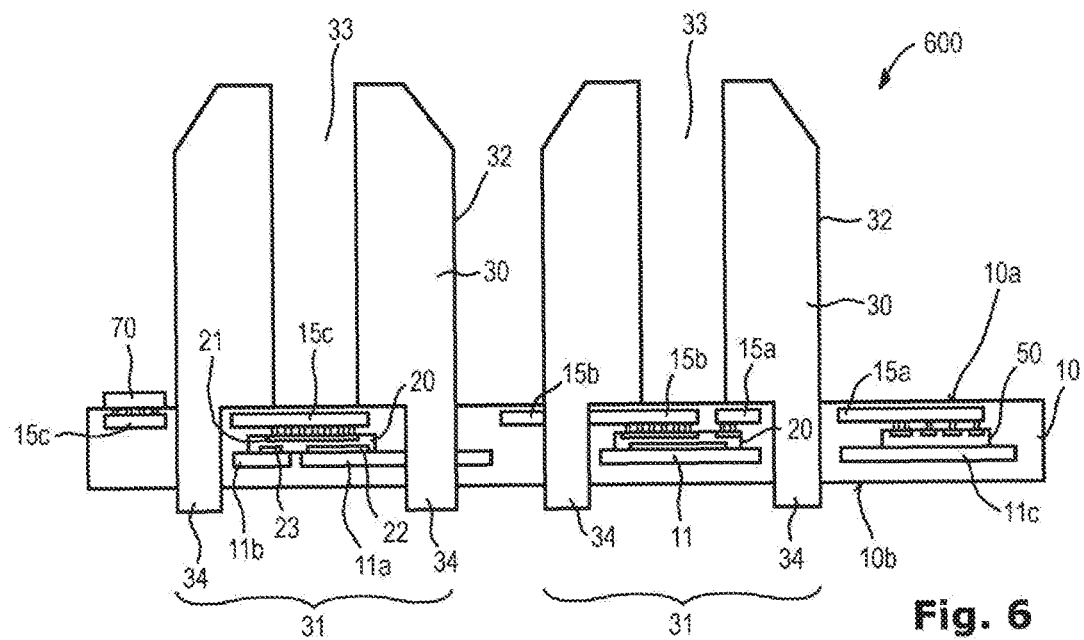
FIG. 6 schematically illustrates a cross-sectional view of an exemplary semiconductor module 600 including a circuit board, two power semiconductor chips and an electronic component embedded therein and a power terminal connector.

FIG. 6 illustrates a semiconductor module 600 including a plurality of power terminal connectors 30 and, e.g., an electronic component 50 as described above in conjunction with FIG. 5. Each of the plurality of power terminal connectors 30 may be fixed to the circuit board 10 in a position such that an embedded power semiconductor chip 20 is positioned within a footprint zone 31 of each of the plurality of power terminal connectors 30. Thus, each power semiconductor chip 20 is individually accommodated with a tightly-coupled heat removal and load current supply capacity provided by the corresponding power terminal connector 30.

In FIG. 6, as an example, a conductor trace (or part) 15b of the second electrically conductive layer 15 is connected to the right-hand power terminal connector 30. The right-hand power terminal connector 30 may, in this example, be a load current terminal for, e.g., providing the source current for the right-hand power semiconductor chip 20. It is to be noted that in the example of FIG. 6, the right-hand power terminal connector 30 may be secured to the second electrically conductive layer 15 rather than to the first electrically conductive layer 11. All connecting techniques described above in relation to the connection between the first electrically conductive layer 11 and the power terminal connector 30, including press-fitting and soldering, may be used.

The left-hand power semiconductor chip 20 may, e.g., be located in a flip-chip orientation on the first electrically conductive layer 11, and an external terminal 70 of the semiconductor module 600 may be connected via a conductor trace (or part) 15c of the second electrically conductive layer 15 to a load electrode 21, e.g. a drain electrode, of the left-hand side power semiconductor chip 20. Here, by way of example, the left-hand power terminal connector 30 may be secured to the first electrically conductive layer 11 as described previously.

It is to be noted that a high variability of chip arrangement and internal wiring of the circuit board 10 is feasible. The power semiconductor chips 20 may be mounted each face-up or each flip-chip or at least one semiconductor chip 20 in flip-chip and at least one semiconductor chips 20 in face-up orientation. Further, the power terminal connectors 30 may be mounted each on the first electrically conductive layer 11 or each on the second electrically conductive layer 15 or at least one terminal connector 30 on the first electrically conductive layer 11 and at least one terminal connector 30 on the second electrically conductive layer 15. Further, the terminal connectors 30 may serve each as drain terminal connectors or source terminal connectors or may serve at least as one drain terminal connector and at least one source terminal connector. Moreover, in many practical examples, the circuit board 10 will comprise, e.g., 3 or 4 or even more electrically conductive layers to allow for more complex internal wiring and functionality.

FIG. 7 is an exemplary illustration of another semiconductor module 700. Semiconductor module 700 is similar to semiconductor module 600 except that both power semiconductor chips 20 are mounted in a face-up orientation on the first electrically conductive layer 11. The first conductive layer 11 may be separated into a first part 11 used as a carrier for the left hand power semiconductor chip 20 and a second part 11' used as a carrier for the right hand semiconductor chip 20. As described before, a structured second electrically conductive layer 15 may optionally be provided for signal routing and/or load current conduction. By way of example, the source electrode of the left hand power semiconductor chip 20 may be connected to the drain electrode of the right hand power semiconductor chip 20 by inter-layer vias 16 connecting the second conductor trace 15b of the second electrically conductive layer 15 to the second part 11' of the first conductive layer 11.

It is to be noted that in all semiconductor modules 100A, 100B, 200-700 additional external terminals for connecting the semiconductor modules 100A, 100B, 200-700 to external applications may be provided. These additional external terminals (such as, e.g., terminals 40, 70) may have any design utilized in the art, e.g. solder pads, leads, etc. Except exemplary external terminals 40, 70 such additional external connectors are not displayed in the figures, but could be provided in any of the semiconductor modules 100A, 100B, 200-700.

FIGS. 8A and 8B illustrate top and bottom views, respectively, of a semiconductor module 800. The connector element 32 of the power terminal connector 30 may, for example, have a polygonal, rectangular, square, rounded or circular outline.

In the semiconductor module 800 as shown in FIG. 8A, the power terminal connectors 30 are equipped with a threaded bolt 38. The threaded bolt 38 may be an integral part of the connector element 32. Thus, in this and also in other examples described herein (see, e.g., FIG. 1B), the (bottom) end face 35 of the connector element 32 may, e.g., be a continuous face which, e.g., completely covers and/or abuts to the area of the first (upper) surface 10a of the circuit board 10 located under the connector element 32.

At the (bottom) second surface 10b of the circuit board 10, the press-fit pins 34 may pass through the circuit board 10 and may protrude from the second surface 10b. As apparent in FIG. 8B, the press-fit pins 34 may have a frame-like shape with an inner zone which is void of press-fit pins 34 (the same may apply for any kind of pins or projections 44). The power semiconductor chip 20 (not visible in FIG. 8B) may be positioned within this inner zone and may thus be laterally surrounded by the frame-like array of press-fit pins 34 (or projections 44). That way, the electrical and thermal connection to the power semiconductor chip 20 via the first conductive layer 11 and the press-fit pins 34 (or projections 44) is very close to the power semiconductor chip 20 and may use the entire peripheral region of the power semiconductor chip 20. Thus, together with the location of the power terminal connector 30 directly above the power semiconductor chip 20, optimum conditions for heat and current transfer are created.

Figure 9:
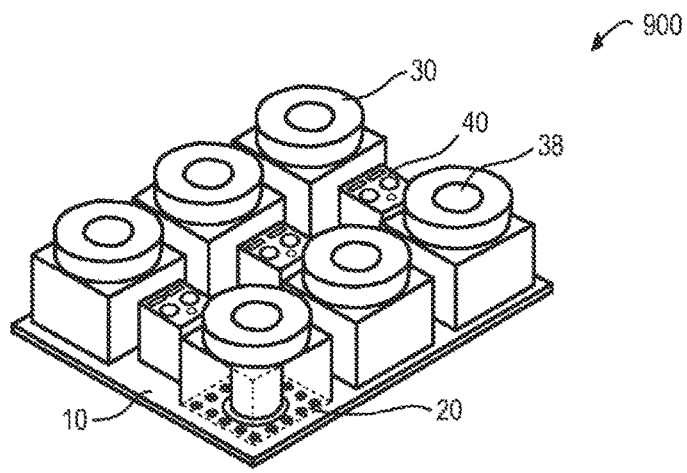
FIG. 9 schematically illustrates a perspective top view of an exemplary semiconductor module 900 such as, e.g., a B6 full bridge.

FIG. 9 exemplifies a semiconductor module 900 which is equipped with a plurality of power semiconductor chips 20 and power terminal connectors 30. Semiconductor module 900 is, for example, a B6 bridge also referred to as a 3-phase bridge rectifier. A B6 bridge rectifier is also referred to as a full bridge rectifier in the art. The B6 bridge rectifier comprises six power transistors or rectifier diodes. One of these 6 power semiconductor chips 20 is visible in the semi-transparent illustration of FIG. 9.

Similar to the semiconductor modules 100A, 100B, 200-800, power terminal connectors 30 are positioned in a vertical projection directly above the power semiconductor chips 20 and are fixed to the circuit board 10 by at least one of the aforementioned techniques, e.g. press-fit connections, through-hole connections, or solder/sinter connections.

As apparent from FIG. 9, the "terminal power connector over power active" approach described herein makes optimum use of the available surface area of the circuit board 10. This approach strongly increases the cooling of power semiconductor modules via the electrical terminals and thus may reduce the need for adding other cooling equipment such as, e.g., heat sinks or the like. Further, the density of power semiconductor chips 20 and electrical components 30 integrated in the circuit board 10 may be increased. This provides for the opportunity to reduce the size of the semiconductor modules 100A, 100B, 200-900 and/or to increase the functionality thereof. In many cases the size of the semiconductor module 100A, 100B, 200-900 may be decreased down to the minimum size dictated by the lateral dimension D1 of the external terminals (i.e. the power terminal connectors 30). In a multi power semiconductor chip module such as, e.g., illustrated in FIG. 9, the multiple power terminal connectors 30 may act as a "heat spreader" which multiply the cooling efficiency and may distribute the cooling over the entire area of the semiconductor module 100A, 100B, 200-900.

It is to be noted that the second (bottom) surface 10b of the circuit board 10 may remain unobstructed and may still remain available for further cooling equipment such, e.g., the application of one or more heat sinks (not shown) or other cooling tools. In this case, the cooling caused by the power terminal connectors 30 may act as an additional cooling to increase the cooling effected by the heat sinks attached to the second (bottom) surface 10b of the circuit board 10.

Figure 10:
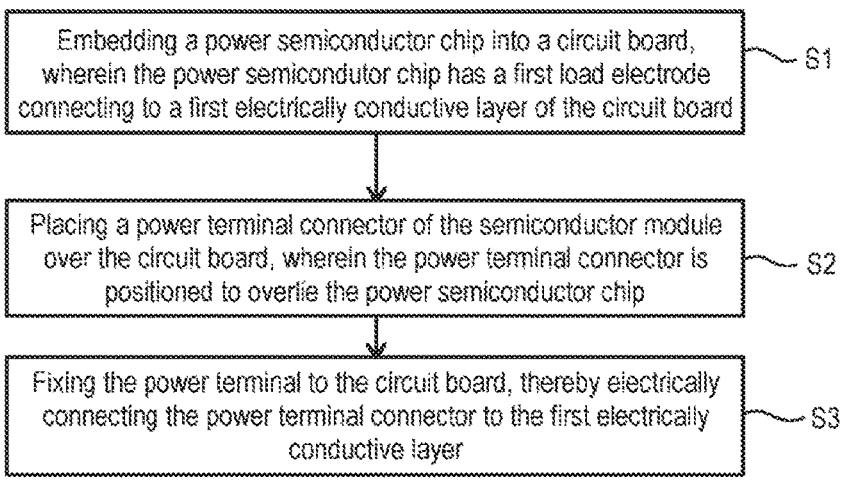
FIG. 10 illustrates a flowchart of an exemplary method of manufacturing a semiconductor module comprising a power semiconductor chip embedded in a circuit board.

FIG. 10 illustrates a flowchart of an exemplary method of manufacturing a semiconductor module comprising a power semiconductor chip 20 embedded in a circuit board 10.

At S1, a power semiconductor chip is embedded into a circuit board, wherein the power semiconductor chip has a first load electrode connecting to a first electrically conductive layer of the circuit board.

Embedding the semiconductor power chip 20 into the construction of the circuit board 10 may be performed by any embedded component technology available. By way of example, the circuit board 10 may be manufactured as a PCB by any known techniques including, e.g., panelization, copper patterning (e.g. photoengraving, milling, chemical etching), lamination, drilling, plating and coating, solder resist application, etc. In this PCB manufacturing process, the power semiconductor chip 20 may be placed on the (e.g. previously structured) conductive layer 11 and then integrated by subsequent lamination steps into the PCB 10. It is to be noted that the conductive layer 11 on which the power semiconductor chip 20 is mounted may also be referred to as a leadframe, if it is a pre-fabricated separate piece which is (also) introduced into the PCB during manufacture.

At S2, a power terminal connector 30 of the semiconductor module may be placed over the circuit board 10, wherein the power terminal connector 30 is positioned to overlie the power semiconductor chip.

At S3, the power terminal connector 30 is fixed to the circuit board 10, thereby electrically connecting the power terminal connector 30 to the first electrically conductive layer 11.

Fixing at S3 may comprise introducing press-fit pins of an array of press-fit pins of the power terminal connector 30 into holes 12 of the first electrically conductive layer 11.

Fixing at S3 may also comprise soldering projections 44 of the power terminal connector 30 to the first electrically conductive layer 11.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor module, comprising:
   a circuit board;
   a power semiconductor chip embedded in the circuit board, the power semiconductor chip having a first load electrode; and
   a power terminal connector electrically connected to the first load electrode,
   wherein the power semiconductor chip is positioned laterally within a footprint zone of the power terminal connector,
   wherein the circuit board comprises a first electrically conductive layer,
   wherein an end face of the power terminal connector comprises an array of press-fit pins engaging with holes of the first electrically conductive layer.

2. The semiconductor module of claim 1, wherein the array of press-fit pins is of a frame-like shape, and wherein the power semiconductor chip is laterally surrounded by the frame-like array of press-fit pins.

3. The semiconductor module of claim 1, wherein the power semiconductor chip is mounted on the first electrically conductive layer.

4. The semiconductor module of claim 1, wherein the first electrically conductive layer extends between the power semiconductor chip and a first surface of the circuit board facing the power terminal connector.

5. The semiconductor module of claim 1, wherein a height of the power terminal connector as measured above a first surface of the circuit board facing the power terminal connector is greater than 6 mm.

6. The semiconductor module of claim 1, wherein a minimum lateral dimension of the footprint zone of the power terminal connector is equal to or greater than 4 mm.

7. The semiconductor module of claim 1, further comprising an electronic component embedded in the circuit board, wherein the electronic component is electrically connected to a second load electrode, a control electrode or another electrode of the power semiconductor chip.

8. The semiconductor module of claim 1, further comprising an electronic component mounted to a surface of the circuit board, wherein the electronic component is electrically connected to a second load electrode, a control electrode or another electrode of the power semiconductor chip.

9. The semiconductor module of claim 1, wherein the power terminal connector has a topologically structured or grooved surface.

10. The semiconductor module of claim 1, wherein the circuit board is a multi-layer PCB.

11. A semiconductor module, comprising:
   a circuit board comprising a first electrically conductive layer and a second electrically conductive layer;
   a plurality of power semiconductor chips embedded in the circuit board, each power semiconductor chip having a first main face mounted on the first electrically conductive layer or mounted on the second electrically conductive layer; and
   a plurality of power terminal connectors each of which is electrically connected to the first electrically conductive layer or to the second electrically conductive layer,
   wherein at least one of the embedded power semiconductor chips is positioned laterally within a footprint zone of at least one of the power terminal connectors,
   wherein an end face of each power terminal connector comprises an array of press-fit pins engaging with holes of the first electrically conductive layer or with holes of the second electrically conductive layer.

12. The semiconductor module of claim 11, wherein at least one of the power terminal connectors is electrically connected to the first electrically conductive layer and at least one other one of the power terminal connectors is electrically connected to the second electrically conductive layer.

13. The semiconductor module of claim 12, wherein the semiconductor module comprises a voltage converter.

* * * * *